US009253001B2

(12) United States Patent  (10) Patent No.: US 9,253,001 B2
Hoshika et al.  (45) Date of Patent: Feb. 2, 2016

(54) PULSE SIGNAL OUTPUTTING APPARATUS

(75) Inventors: Hiroaki Hoshika, Hitachinaka (JP); Takeo Hosokawa, Hitachinaka (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 38 days.

(21) Appl. No.: 14/355,371

(22) PCT Filed: Nov. 28, 2011

(86) PCT No.: PCT/JP2011/006593
§ 371 (c)(1),
(2), (4) Date: Apr. 30, 2014

(87) PCT Pub. No.: WO2013/080240
PCT Pub. Date: Jun. 6, 2013

(65) Prior Publication Data
US 2014/0301502 A1   Oct. 9, 2014

(51) Int. Cl.
*H04L 27/12*   (2006.01)
*H03K 5/12*   (2006.01)
*H03K 6/04*   (2006.01)

(52) U.S. Cl.
CPC *H04L 27/12* (2013.01); *H03K 5/12* (2013.01); *H03K 6/04* (2013.01)

(58) Field of Classification Search
CPC .............. H03B 5/32; H03K 5/12; H03K 6/04; H04L 27/12
USPC ........... 375/295; 332/107; 327/170; 330/296; 331/107 R, 108 R
See application file for complete search history.

(56) References Cited

U.S. PATENT DOCUMENTS

| 7,385,450 B2 * | 6/2008 | Fukuda et al. ................ 330/296 |
| 2007/0063197 A1 * | 3/2007 | Burkatovsky .................. 257/49 |
| 2010/0308838 A1 * | 12/2010 | Lee et al. ...................... 324/537 |

FOREIGN PATENT DOCUMENTS

| JP | 59-61489 A | 4/1984 |
| JP | 1-130615 A | 5/1989 |
| JP | 6-84636 A | 3/1994 |
| JP | 2006-325256 A | 11/2006 |

OTHER PUBLICATIONS

Corresponding International Search Report with English Translation dated Jan. 17, 2012 (two (2) pages).

* cited by examiner

*Primary Examiner* — Jeffrey Shin
(74) *Attorney, Agent, or Firm* — Crowell & Moring LLP (57) ABSTRACT

Radiated noises of an output pulse signal are reduced. A pulse signal outputting apparatus outputs a pulse signal generated by a modulating means outside, the modulating means includes a calculation circuit that has a pull-up resistor which is connected to power supply inside, a general-purpose input/output terminal that is connected to the calculation circuit, input/output selecting means for selecting whether the general-purpose input/output terminal is used as an input terminal or an output terminal, pull-up resistor connecting means for connecting or disconnecting the pull-up resistor and the general-purpose input/output terminal, and a pull-up resistor connection control circuit that performs control so that the pull-up resistor connecting means is operated when the general-purpose input/output terminal is selected as the input terminal, the general-purpose input/output terminal is selected as the input terminal by the input/output selecting means when a transition of an output signal level of the pulse signal starts, the pull-up resistor and the general-purpose input/output terminal are connected by the pull-up resistor connecting means when the general-purpose input/output terminal is selected as the input terminal, and the general-purpose input/output terminal is switched to the output terminal by the input/output selecting means after a certain period of time has passed.

8 Claims, 13 Drawing Sheets

(12)  United States Patent

PULSE SIGNAL OUTPUTTING APPARATUS

TECHNICAL FIELD

The present invention relates to a pulse signal outputting apparatus performing a method of processing a detected physical amount by a calculation circuit such as a micro processor and outputting the result as pulses to the outside.

BACKGROUND ART

A sensor that detects various kinds of physical amounts such as temperature, pressure, or a flow rate is used in a vehicle, a consumer appliance, and industrial equipment for control or securing safety. Such a sensor is configured by a physical amount detecting unit that extracts a physical amount as an electric signal, an electrical signal processing unit that amplifies the electric signal to a desired amplitude, an output signal modifying unit that outputs the detected physical amount to the outside, and the like. The output signal is input to an apparatus that reads a signal of the sensors and performs a certain kind of control or display and the like. Since such an apparatus changes an operation or a display thereof based on information from the sensor, an output signal of the sensor should not cause physical amount information to deteriorate in signal transmission or should not increase electromagnetic noises caused by the transmission of the signal and the like, in order to obtain high reliability.

Meanwhile, recently, there is a case where a calculation circuit is used in a part or all of the electric signal processing unit or the output signal modulating unit. In this case, it is reasonable that a modulation technique by a pulse signal that can be easily handled by the calculation circuit is used for the output signal of the sensor. Though the modulation by a pulse signal includes frequency modulation, PWM modulation, PCM modulation, and the like, any of these uses binary logic or time between pulses.

Since such a signal does not have a median level, information transmission is highly accurate, but electric noises are likely to increase due to a steep change of a signal level. Therefore, a through rate control technique in which logic transition speed of the pulse signal is properly smoothed is used.

For example, a technique for such control is disclosed in PTL 1.

PTL 1 discloses a circuit example in which logic transition speed of a digital signal is smoothed, and an original digital value is input to an on/off generator 9 and causes a transistor Q1 to be turned on and also a transistor Q3 by an ON signal. Series resistors R1 and R2 are connected to a circuit switched by the transistor Q3 and a capacitor C is connected to a connecting point of the resistors R1 and R2. Therefore, a potential at an output signal drawing point a is continuously and gradually increased based on time constants of the resistor R1 and the capacitor C. In this manner, adjustment of logic transition speed with time constants of a resistor and a capacitor is widely performed. If a plurality of capacitors and resistors are prepared by using such a circuit and switching is performed by a selecting switch (such as a transistor), through rate control can be arbitrarily performed.

Further, PTL 2 discloses a technique of adjusting logic transition speed only with a transistor without using a passive component such as a resistor or a capacitor.

PTL 2 discloses that an output control circuit 3 that drives transistors 11 and 12 of an output unit has a function for controlling electric current for driving the transistors 11 and 12. In specific, as illustrated in FIG. 2, transistor groups MN1 to MNn that have different electric current driving capabilities are provided, the respective transistor groups have independent signals TA1 to TAn for driving transistor groups MN1 to MNn, and selectively use the signals TA1 to TAn in order to provide a desired logic transition speed to an OUT terminal of FIG. 1. Since each of the transistor groups has a different electric current driving capability, continuous and smooth driving signals can be obtained depending on selection of the transistor groups, thereby functioning as through rate control.

CITATION LIST

Patent Literature

PTL 1: JP-A-59-061489
PTL 2: JP-A-2006-325256

SUMMARY OF INVENTION

Technical Problem

As described above, there is a problem in that switching transistor groups with different electric current driving capabilities by including resistors and capacitance and providing a circuit that switches the resistors and capacitance requires more additional components than in a case where the switching is not performed. This increases a component mounting area and further increases a price of an apparatus. Therefore, it is difficult to apply this to a small and cheap product.

In addition, if a plurality of transistor groups with different electric current driving capabilities are provided, a method of integrating the transistors in an integrated circuit which is not greatly influenced by the increase of the number of the used transistors is generally used. However, in this case, a through rate control circuit needs to be prepared in advance in a stage of designing the integrated circuit. Therefore, it is difficult to be applied to an existing circuit which is currently used, especially an output terminal of a general-purpose microcomputer, and the like. That is, it is difficult to enable the through rate control and to reduce radiated noises of an output pulse signal even if a signal output circuit may not be changed easily similar to the general-purpose microcomputer.

An object of the invention is to reduce radiated noises of an output pulse signal.

Solution to Problem

In order to solve the problems described above, a pulse outputting signal apparatus according to the invention includes physical amount detecting means for detecting a physical amount, and modulating means for performing pulse modulation on output information obtained from the physical amount detecting means, and outputs a pulse signal generated in the modulating means outside, the modulating means includes a calculation circuit that has a pull-up resistor which is connected to a power supply inside; a general-purpose input/output terminal that is connected to the calculation circuit; input/output selecting means for selecting whether the general-purpose input/output terminal is used as an input terminal or an output terminal; pull-up resistor connecting means for connecting or disconnecting the pull-up resistor and the general-purpose input/output terminal; and a pull-up resistor connection control circuit that performs control so that the pull-up resistor connecting means is operated when the general-purpose input/output terminal is selected as the input terminal, the general-purpose input/output terminal is selected as the input terminal by the input/output selecting means when a transition of an output signal level of the pulse signal starts, the pull-up resistor and the general-purpose input/output terminal are connected by the pull-up resistor connecting means when the general-purpose input/output terminal is selected as the input terminal, and the general-purpose input/output terminal is switched to the output terminal by the input/output selecting means after a certain period of time is passed.

Advantageous Effects of Invention

According to the invention, radiated noises of an output pulse signal can be decreased.

DESCRIPTION OF EMBODIMENTS

Hereinafter, embodiments of the invention are described with reference to the drawings. Here, the present embodiments in which an output signal is a detected signal of a physical amount detecting device are described, but an advantage of the invention is the same whatever the detected physical amount is.

Embodiment 1

A first embodiment of the invention is described with reference to FIGS. 1 to 12.

A system using an electronic control device and a physical amount detecting device including various kinds of sensors are widely used for a natural phenomenon or a weather condition, or in machinery or a vehicle.

Figure 1:
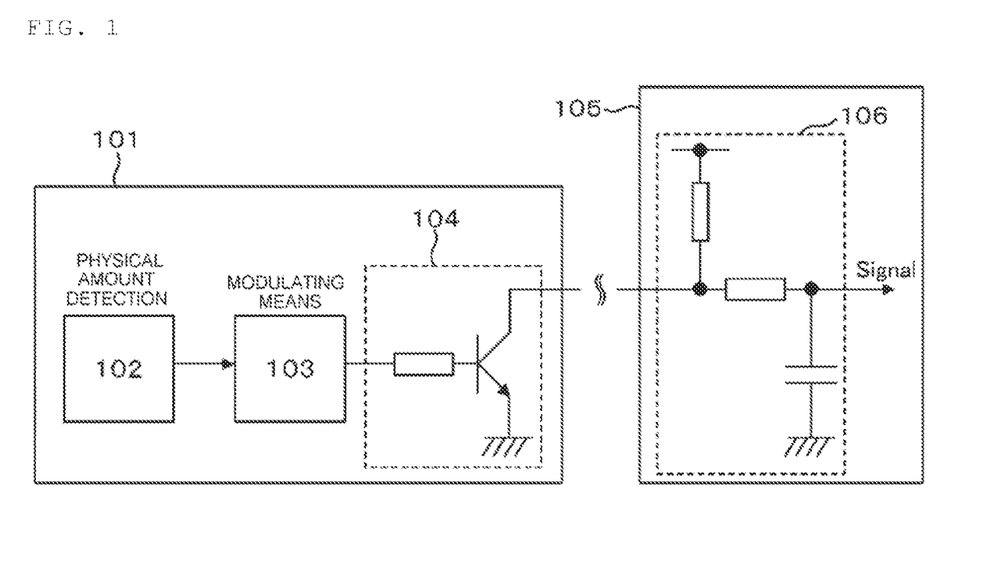
FIG. 1 is a diagram illustrating a configuration of a physical amount measuring apparatus according to an embodiment of the invention.

As illustrated in FIG. 1, a sensor 101 and an electronic control device 105 are electrically connected. Information obtained from physical amount detecting means 102 that detects a physical amount is subjected to pulse modulation by modulating means 103, and transmitted through an output circuit 104 to the electronic control device 105. The electronic control device 105 includes a signal input circuit 106 in order to remove an electric noise and the like. The output circuit 104 and the electronic control device 105 are connected by using an electric cord such as a wire harness, and the output circuit 104 includes a waveform smoothing circuit as described below in order to reduce radiated noises from the cord.

Figure 2:
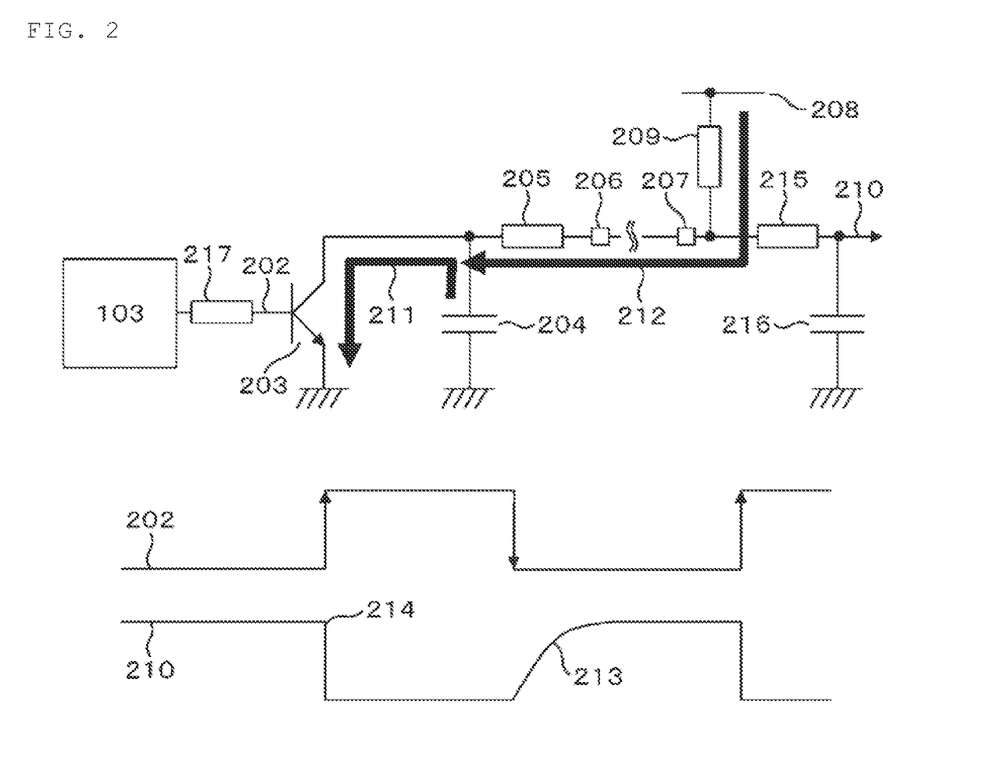
FIG. 2 is a diagram illustrating a configuration of an external output circuit according to the embodiment of the invention.

FIG. 2 illustrates a circuit portion from the modulating means 103 embedded in the sensor 101 to the signal input circuit 106 embedded in the electronic control device 105. The output circuit 104 generally uses a so-called open collector method in which an emitter of a transistor 203 is grounded and a collector is connected to an output of a pulse signal. In the electronic control device 105, the output of the pulse signal is connected to a power supply 208 through a pull-up resistor 209. Further, a base terminal of the transistor 203 is connected to the modulating means 103 via a resistor 217, and control is performed so that the transistor is connected if a signal from the modulating means 103 has positive logic, and disconnected if a signal from the modulating means 103 has negative logic. Meanwhile, the pulse signal passes through a filter circuit configured by a resistor 215 and a capacitor 216 to finally become a pulse signal 210, and is used for various kinds of control in the electronic control device 105. When the transistor 203 is connected, the pulse signal is grounded so the pulse signal turns to have negative logic. Otherwise, when the transistor 203 is disconnected, the pulse signal turns to have positive logic at the pull-up resistor 209. The pulse signal 210 can be continuously obtained by repeating this operation. At this point, the base voltage signal waveform of the transistor 203 is denoted by reference number 202. Reference number 210 of FIG. 2 denotes a pulse signal waveform that is used in the electronic control device. For the reason described, below, even if the base signal waveform 202 has steep leading and trailing waveforms, the trailing edge of the pulse signal 210 is steep as indicated by reference number 214, and the leading edge is smooth as indicated by reference number 213.

Figure 3:
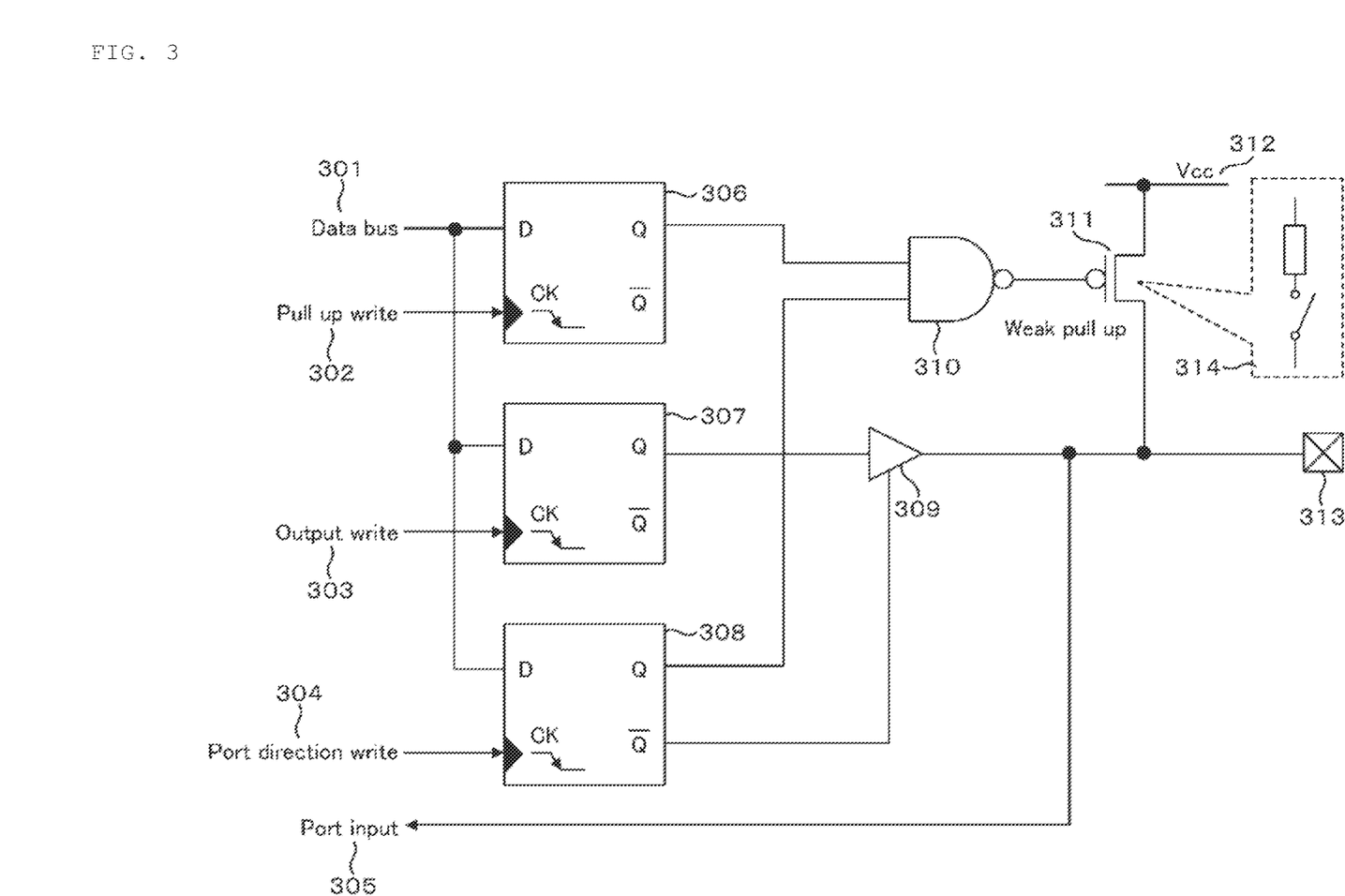
FIG. 3 is a diagram illustrating an inside structure of a modulating circuit according to the embodiment of the invention.

FIG. 3 illustrates a circuit configuration when a calculation circuit is used in the modulating means 103. A modulating circuit for a pulse signal has various kinds of methods, and the same advantage can be obtained even by another method in which the calculation circuit is not used.

A terminal 313 is a general-purpose input/output terminal of the calculation circuit, and can be used as either the input terminal or the output terminal by a 3-state buffer 309 and an input/output switching flip flop 308. Further, if the terminal 313 is switched to the input terminal, a pull-up function in which the calculation circuit is embedded can be used by a gate 310, a pull-up FET 311, and a pull-up control flip flop 306. Each of the flip flops is connected to an internal data bus of the calculation circuit, and each of write enable terminals 302, 303, and 304 determines a value of a data bus 301 by generating an edge, and performs function switching and logical determination for the output terminal. For example, if the terminal 313 is switched to the output terminal, the data bus 301 turns to have negative logic, an edge is generated at the input/output switch-enabled terminal 304, a Q-bar terminal of the flip flop 308 turns to have positive logic, the 3-state buffer 309 becomes a buffer mode, and a logic state at a Q terminal of a terminal outputting flip flop 307 is transmitted to the terminal 313. At the same time, an input of the pull-up control gate 310 at one side turns to be negative logic, the pull-up FET 311 is compulsorily disconnected. In contrary, if the terminal 313 is switched to the input terminal, the data bus 301 turns to have positive logic, an edge is generated at the input/output switch-enabled terminal 304, the Q-bar terminal of the flip flop 308 turns to have negative logic, the 3-state buffer 309 turns into a high impedance state, and the terminal 313 and a Q terminal of the terminal outputting flip flop 307 are disconnected. Accordingly, a terminal input 305 can read a logical level of a terminal. At the same time, an input of the pull-up control gate 310 at one side turns to be positive logic, and connection or disconnection of the pull-up FET 311 can be controlled at the pull-up control flip flop 306. A calculation circuit with such a circuit can switch an input or an output of the terminal 313 by software. Further, if the terminal 313 is switched to the input, the embedded pull-up function can be also selected freely.

Here, the pull-up FET 311 functions as a weak pull-up, and has a resistance value greater than a general semiconductor switch as indicated with reference number 314 in the same manner.

Figure 4:
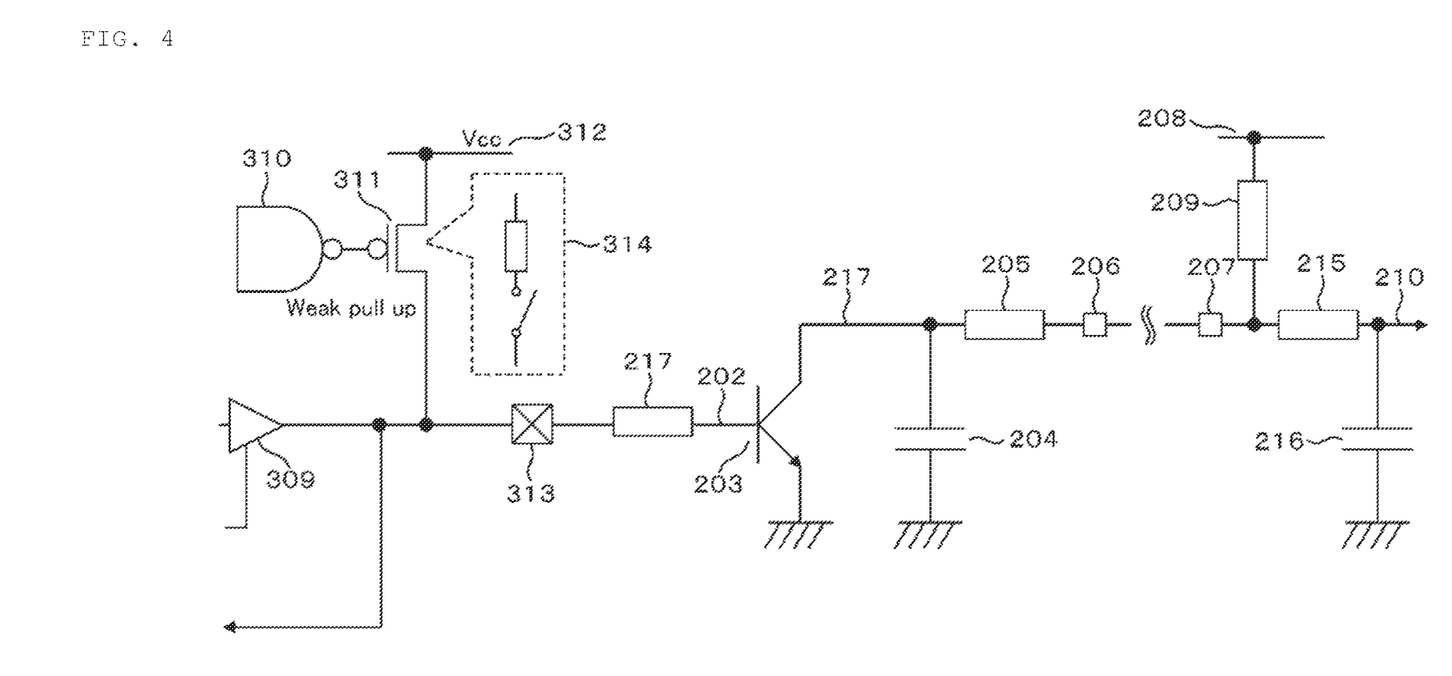
FIG. 4 is a diagram illustrating a circuit structure in which the modulating circuit and the output circuit are combined according to the embodiment of the invention.

FIG. 4 integrally illustrates the circuit of FIG. 2 and the pull-up portion of FIG. 3 and collectively illustrates an electrical connection state from a signal output portion of the sensor 101 to the signal input circuit 106 of the electronic control device 105.

Figure 10:
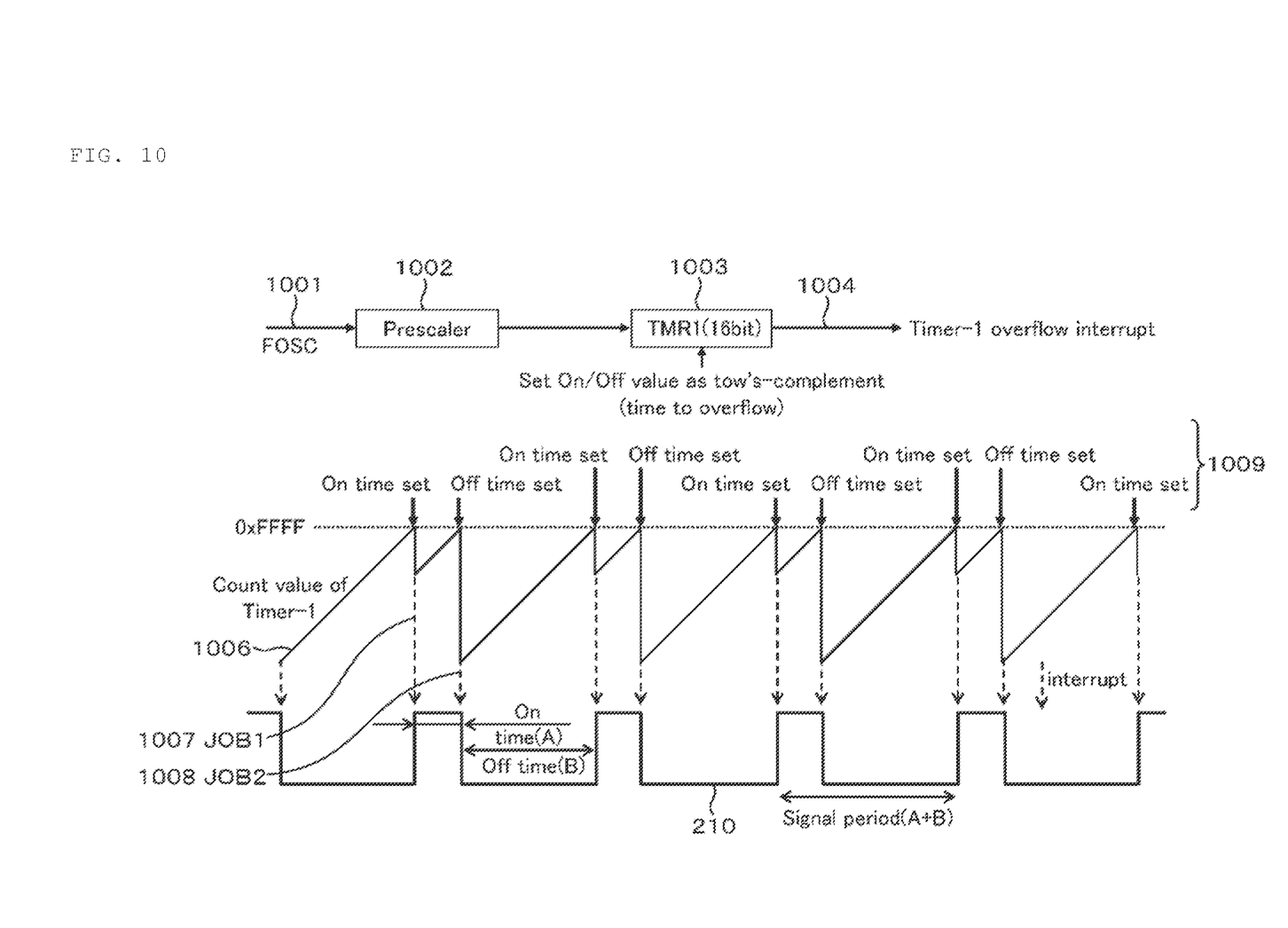
FIG. 10 is a diagram illustrating pulse signal generating means according to the embodiment of the invention.

FIG. 10 illustrates an example in which duty ratio modulation (PWM modulation) of a pulse signal which is processed in the modulating means 103 using a microcomputer is performed by software and a general-purpose timer. In the PWM modulation, both of a leading edge and a trailing edge of a pulse signal are used, and time between the edges is also important. Accordingly, if the leading and trailing edges of the signal are not made to be extremely steep and stable, the pulse signal 210 causes a modulation error when the signal is received by the electronic control device 105. After a reference clock signal 1001 is divided into desired frequencies by a prescaler 1002, the pulse signal is input to a timer 1003 to perform a counting-up operation. Since a maximum count number of the timer is limited, when the count number becomes a maximum, overflow occurs, and an interruption request 1004 to the calculation circuit is generated. Accordingly, if count-up is performed by writing a value obtained by subtracting time until a next interruption process is performed, from a value in which overflow occurs, means for generating an interruption request from the timer 1003 after a certain period of time can be configured. Reference number 1006 schematically illustrates a value counted in the timer 1003, and the interruption process JOB1 (1007) or JOB2 (1008) described below is performed whenever the timer 1003 reaches the maximum value to cause overflow to occur. In these processes, in order to control an operation of the pulse signal 210 and time for performing a next interruption request, a certain modulation signal is generated by sequentially writing numbers on the timer 1003. This method performs a voltage level transition of the pulse signal 210 by software process. An example of using overflow interruption of a timer is described above, but the same advantage of the invention can be obtained if interruption of using a comparison match or another kind of time control means is used.

As the voltage waveforms of the leading and trailing edges are steeper, accuracy and stability of the PWM modulation as a signal are increased, but a change in an electric current becomes steep at the same time to increase electric noises. Further, since the PWM modulation is a pulse signal, higher harmonic waves in a wide frequency range are generated. A countermeasure for the generation is required. Therefore, a through rate control circuit is used as disclosed in PTLs 1 and 2.

However, cheap and small equipment in which a through rate control circuit may not be embedded, such as a physical amount detecting sensor, as the countermeasure generally performed simply increases capacitance of a capacitor 204 in FIG. 2 to smooth only a leading edge of a pulse signal as indicated by the reference number 213. In this case, since electric charges of the capacitor 204 directly flow to the transistor 203 in the ground direction at the time of the trailing edge, the capacity increase of the capacitor 204 does not contribute to sound reduction at the time of the waveform trailing edge. Therefore, in order to satisfy a desired radiated noise performance, a capacity of the capacitor 204 needs to be increased. However, in the PWM modulation described above, waveform smoothing by increasing the capacity of the capacitor 204 causes accuracy of the modulated signal to be degraded. In this manner, the accuracy of the pulse signal modulation and the decrease of the radiated noises in the PWM modulation have a conflicting relationship.

Figure 9:
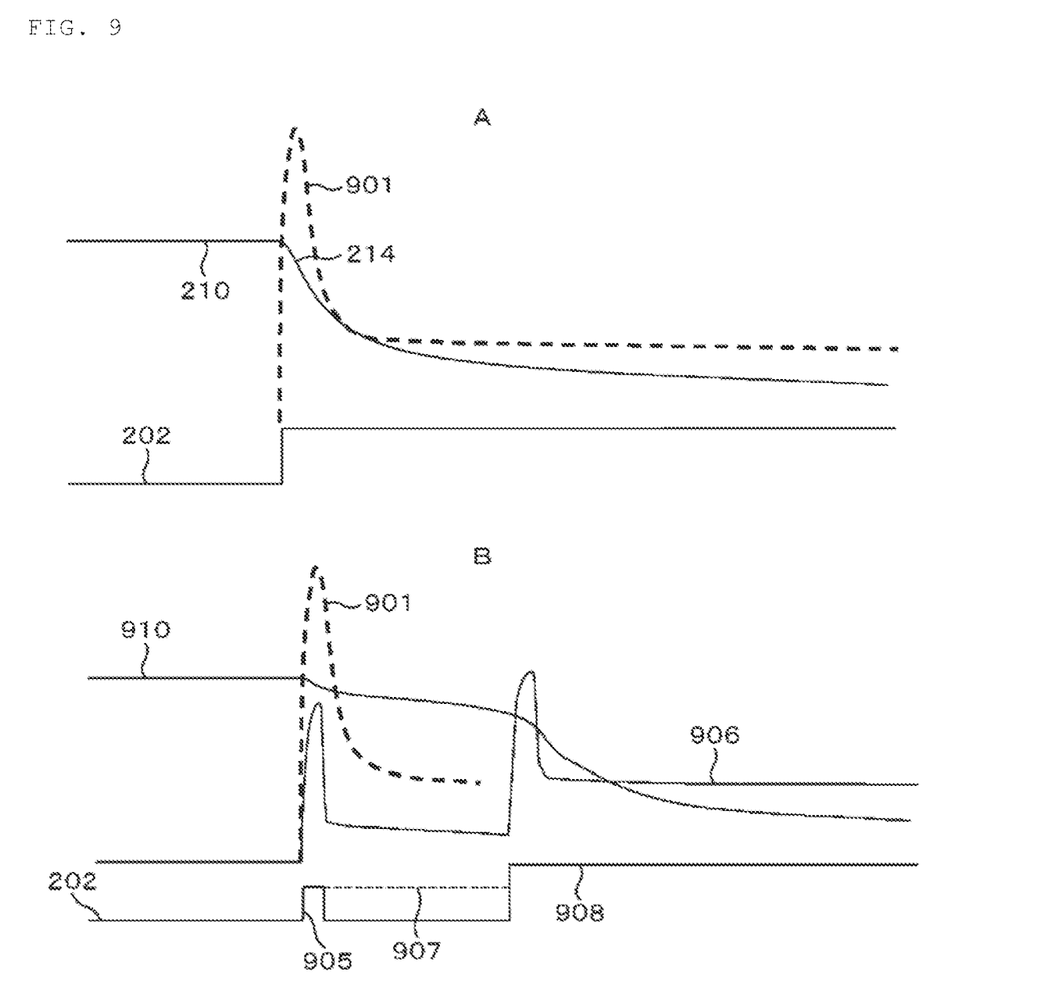
FIG. 9 is a diagram illustrating voltages and electric current waveforms of each component according to the embodiment of the invention.

Means for improving the conflicting relationship is described with reference to FIG. 9, FIG. 9A illustrates a trailing edge waveform of the pulse signal 210 and the base voltage waveform 202 of the transistor 203 with time delayed than FIG. 2 when the invention is not applied. Further, reference number 901 schematically indicates a value of an electric current that flows through a current path 211 in FIG. 2. If the general-purpose input/output terminal 313 of the calculation circuit illustrated in FIG. 3 turns to have positive logic as the output terminal, the base voltage of the transistor 203 increases and the transistor 203 becomes an ON state. In other words, the transistor is driven in a saturation region by applying a sufficient electric current to the base of the transistor. At this point, the voltage between the collector and the emitter is small and the collector terminal is almost grounded. Therefore, the pulse signal 210 is decreased nearly to the ground voltage to create the trailing edge 214 of the pulse signal. The waveform 901 illustrates an electric current that flows through the current path 211 at this time. When the transistor 203 is turned on, certain electrical charges in the capacitor 204 of FIG. 2 are released at the same time. Therefore, a steep trailing edge of the pulse signal 210 can be obtained. However, a high electric current peak value is generated as a reaction as indicated by the reference number 901. Further, since an electric current generated in response to voltage difference between an ungrounded terminal of the capacitor and the power supply 208 in the signal input circuit 106 flows through the current path 212 of FIG. 2, a steep electric current flows through a long conductor (wire harness) that connects the electronic control device 105 and the sensor 101. Therefore, large radiated noises are generated.

FIG. 9B is a diagram illustrating each waveform in the same manner as above when the invention is applied. In the example, the general-purpose input/output terminal of the calculation circuit is set to be the input terminal right before the transistor 203 is turned on. If the terminal is set to be the input terminal, since a pull-up resistor embedded in the calculation circuit becomes available as illustrated in FIG. 3, the base of the transistor 203 is driven via the pull-up resistor with the pull-up FET 311 connected so that the base voltage 202 can be driven in an intermediate voltage, that is, the transistor 203 can be driven in an active region, not the saturation region. At this time, the base voltage 202 of the transistor 203 becomes a base voltage lower than when the terminal 313 of the calculation circuit is driven as the output terminal. Since a voltage of a transistor between a collector and an emitter in the active region is increased, it is substantially equivalent to discharging electric charges of the capacitor 204 via resistance, and the voltage of the pulse signal 210 is gradually decreased. Therefore, an electric current depending on the voltage difference from the power supply 208 in the signal input circuit 106, that is, the maximum, value of the electric current that flows through the wire harness becomes lower than in FIG. 9A. Since the time period, in which the transistor 203 is driven in the active region, can be arbitrarily adjusted by the software of the calculation circuit, the calculation circuit can control how long the transistor 203 is driven in the active region. Further, in this state, the intermediate state as indicated by the reference number 907 with the pull-up FET disconnected can be maintained for some time. Meanwhile, in this state as it is, since the trailing edge voltage waveform of the pulse signal 210 is unnecessarily smooth, a clear trailing edge waveform is formed by changing the terminal 313 to the output terminal after a certain period of time from the first start of the operation of the transistor in the active region. This is because desired accuracy of the signal modulation at the time of modulating a PWM signal in the electronic control device 105 is required to be obtained. At this time, a steep electric current peak is also generated by discharging of the capacitor 204, but since the voltage of the pulse signal 210 is already decreased to a degree, the electric current value and the radiated noises are smaller than in the case of FIG. 9A.

The aforementioned specific circuit operation is described with reference to FIGS. 5 to 8.

Figure 5:
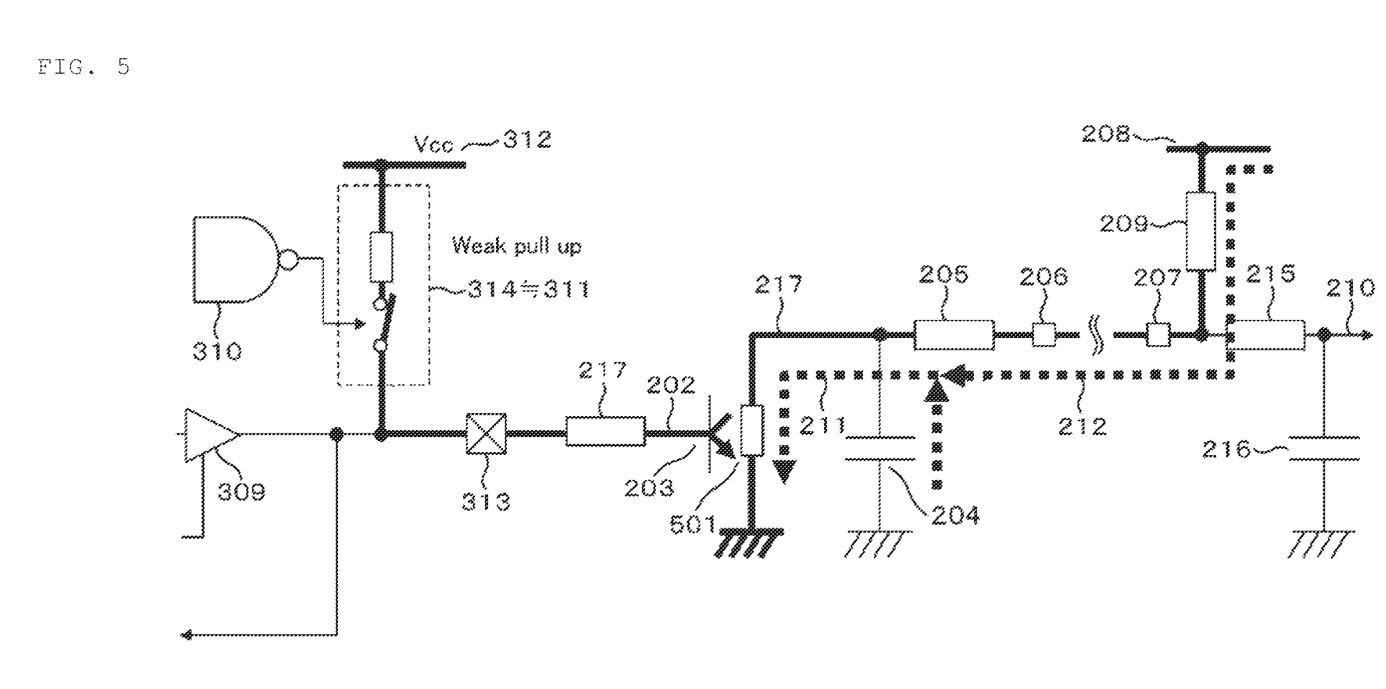
FIG. 5 is a diagram illustrating a current path at the time of signal level transition according to the embodiment of the invention (active region).
Figure 6:
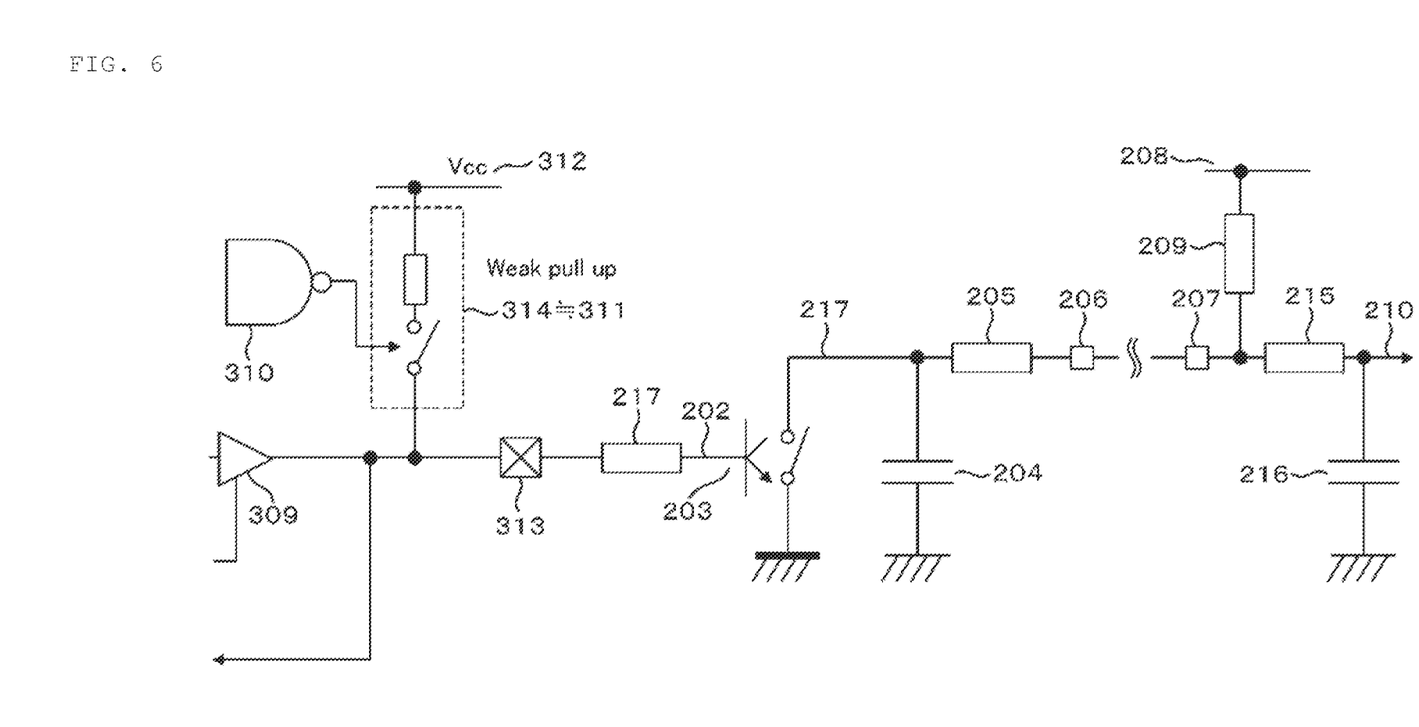
FIG. 6 is a diagram illustrating the current path at the time of the signal level transition according to the embodiment of the invention (retention region).
Figure 7:
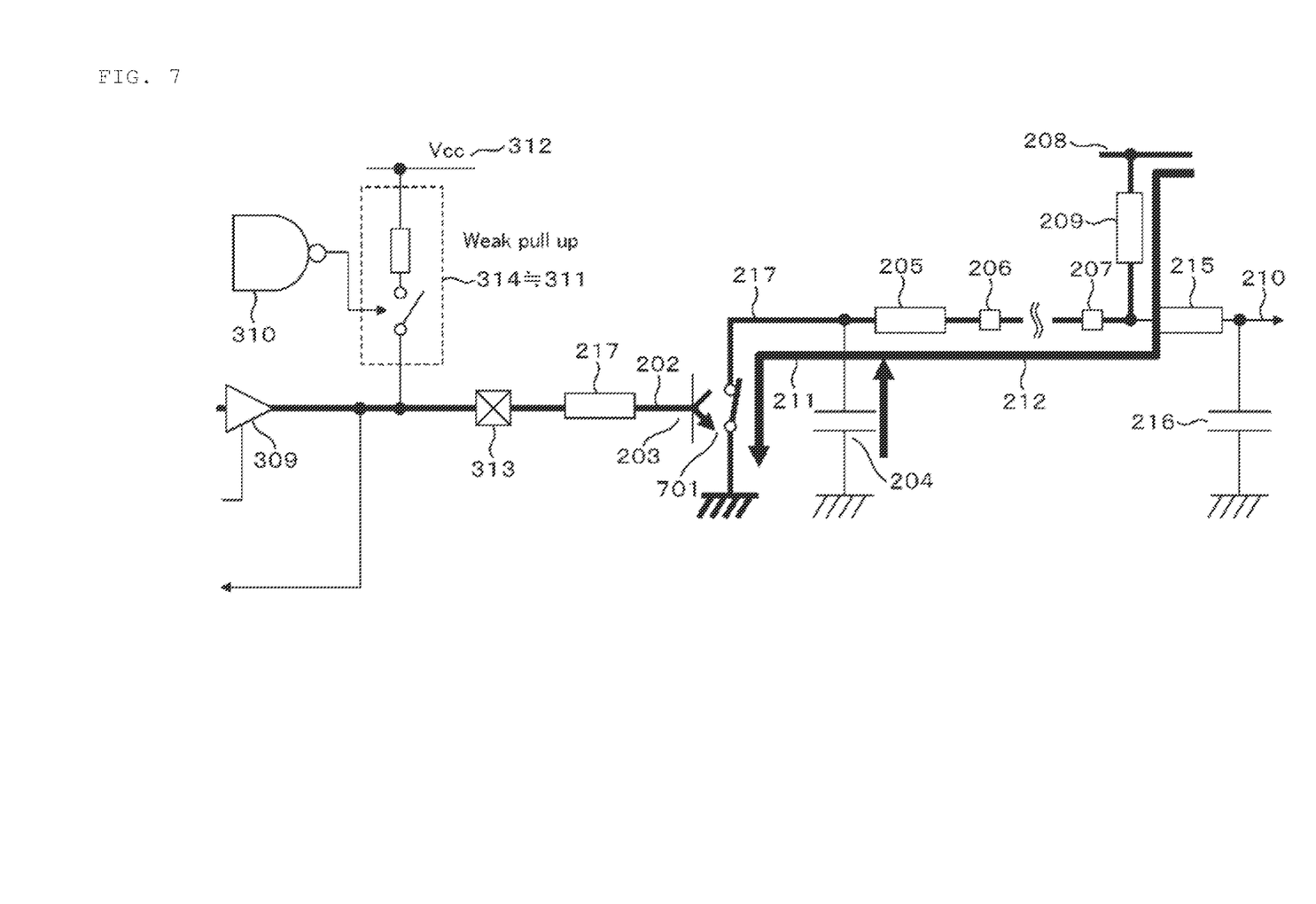
FIG. 7 is a diagram illustrating the current path at the time of the signal level transition according to the embodiment of the invention (saturation region).
Figure 8:
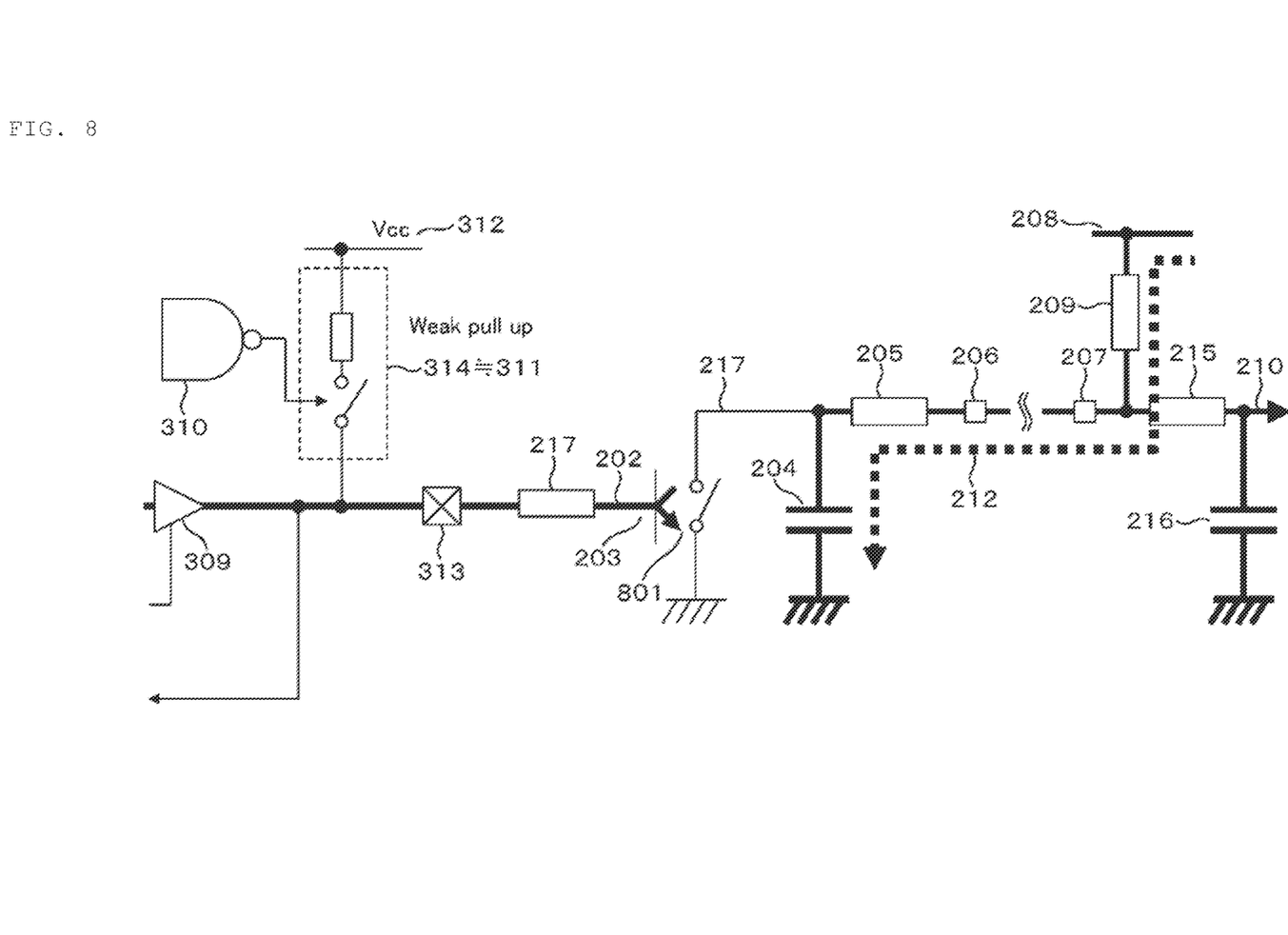
FIG. 8 is a diagram illustrating the current path at the time of the signal level transition according to the embodiment of the invention (charge region).

FIG. 5 has the same basic configuration with the circuit diagram of FIG. 4, but an equivalent circuit is illustrated in a part. In FIG. 5, the terminal 313 is set to be the input terminal, and the pull-up FET 311 is connected. FIG. 6 illustrates a state in which the terminal 313 is maintained to be the input terminal as it is, and the pull-up FET 311 is disconnected. FIG. 7 illustrates a state in which the terminal 313 is set to be the output terminal and outputs positive logic, and the transistor 203 is connected. FIG. 8 illustrates a state in which the terminal 313 is set to be the output terminal and outputs negative logic, and the transistor 203 is disconnected.

As illustrated in FIG. 5, if a trailing edge operation is performed on the pulse signal 210 which is pulled up by the pull-up resistor 209 in the electronic control device 105, the terminal 313 is first set to be the input terminal and the pull-up FET 311 is connected. Then, a base current flows to the transistor 203 via the series resistor 217 connected to the base of the transistor 203 and the resistor of the pull-up FET 311. As to the electric current, since the pull-up FET 311 is a weak pull-up as described above, the base current is restricted and the transistor 203 operates in the active region. Since the transistor 203 is considered as a resistor as indicated by reference number 501 by the operation in the active region, electric charges in the capacitor 204 are gradually discharged and the direct current 212 of the pull-up resistor 209 in the electronic control device is also restricted. As a result, the trailing edge of the pulse signal 210 gradually starts.

FIG. 6 illustrates a state in which the pull-up FET 311 is disconnected and the transistor 203 is disconnected from the state of FIG. 5. Therefore, the voltage level of the pulse signal 210 is maintained or gradually decreased in the short run. The same state can be obtained if the terminal 313 is set to be the output terminal, but this state does not need an operation of switching the terminal 313 to the output terminal, so switching to this state can be quickly performed.

In FIG. 7, the terminal 313 is changed to the output terminal and outputs positive logic, and the transistor 203 is operated in the saturation region. Since the voltage between the collector and the emitter in the saturation region is small, the transistor 203 is schematically illustrated as a switch as indicated by reference number 701. The electric current 211 from the capacitor 204 and the pull-up resistor 209 steeply flows to the transistor 203. Therefore, though the trailing edge voltage waveform of the pulse signal 210 becomes steep, the trailing edge voltage waveform becomes a clear edge in the PWM modulation, and the accuracy of the pulse signal can be prevented from being degraded. If the invention is not applied, the trailing edge operation of the pulse signal 210 is in the state of FIG. 7 at first, and generates large radiated noises.

FIG. 8 illustrates an operation at the time of the leading edge of the pulse signal 210. FIG. 8 illustrates a state in which after the voltage of the pulse signal 210 is decreased, that is, after the state of FIG. 7 is maintained for a certain period of time, the pulse signal 210 is put to a high potential level, again. Since the transistor 203 is disconnected as indicated by reference number 801, the capacitor 204 is charged from the pull-up resistor 209 of the electronic control device 105 so that the potential of the pulse signal 210 is gradually increased. The degree of increase is determined by a time constant obtained from constants of a pull-up resistor 909, a series resistor 205, and the capacitor 204. Though the decrease of the radiated noises at the time of a signal leading edge generally increases a capacity of the capacitor 204, this also increases electric current that flows through the transistor 203 at the time of trailing edge at the same time to cause increase of the radiated noises at the time of trailing edge. Further, the accuracy of the pulse signal 210 in the PWM modulation is also degraded.

In this manner, the states of FIGS. 5, 6, and 7 are quickly and sequentially switched at an initial stage of the trailing edge operation of the pulse signal 210 so that the trailing edge waveform is smoothed and the radiated noises at the time of the trailing edge of the pulse signal 210 are decreased. Accordingly, the noise request characteristics of equipment are satisfied without depending on the increase of the capacity of the capacitor 204 and further the signal accuracy of the PWM modulation can be increased.

Figure 11:
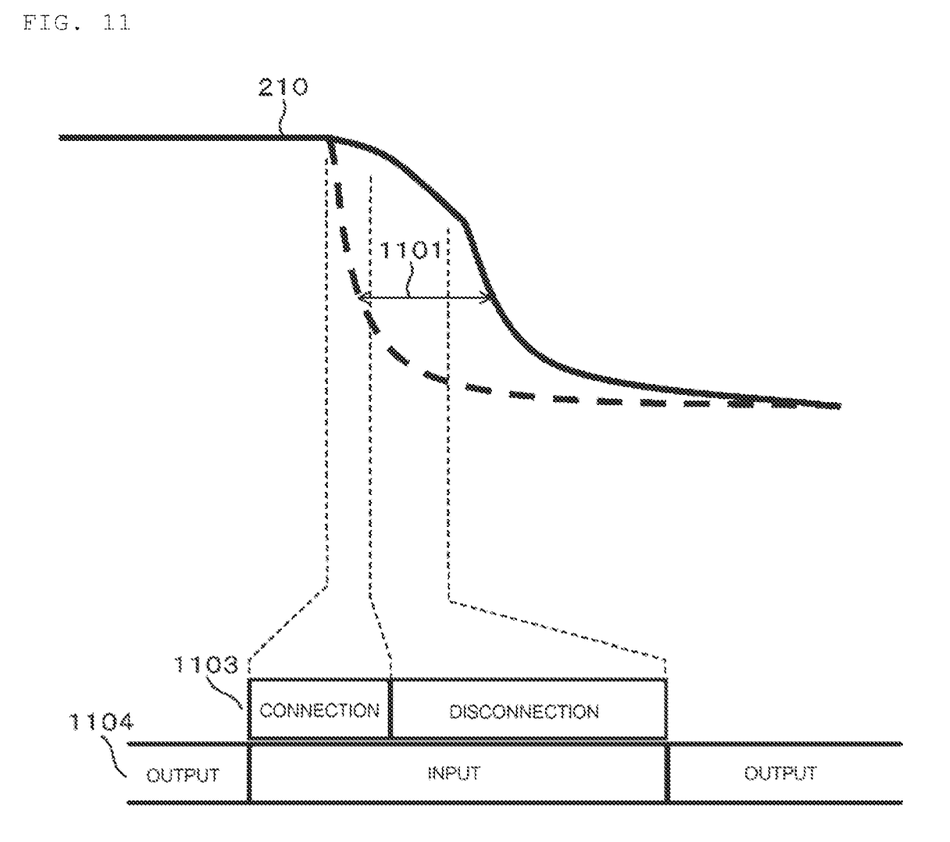
FIG. 11 is a diagram illustrating an operation of the modulating circuit according to the embodiment of the invention.

FIG. 11 illustrates the operation of the circuit by chronically illustrating the voltage waveform of the pulse signal, the input or output direction of the terminal, and the connection state of the pull-up. Further, the pulse signal 210 when the invention is not applied is indicated with a dashed line. Reference number 1103 indicates connection states of the pull-up FET 311. Reference number 1304 indicates input and output states of the terminal 313. If it is time to perform a trailing edge operation of the pulse signal 210, the terminal 313 is switched to the input terminal, and the pull-up FET 311 is connected at the same time or right after the switching of the terminal. The pull-up FET 311 is disconnected after being connected for a certain period of time, and the terminal 313 is switched to the output terminal after a certain period of time further to output positive logic. If the switching is performed in this manner, the trailing edge waveform of the pulse signal 210 is smoothed to decrease radiated noises and the terminal 313 is switched to the output terminal on the way so that a clear edge can be generated near a logic threshold value of the electronic control device 105. If this operation is performed, the trailing edge is delayed as indicated by Reference number 1101, but the time is correlated to a series of operating times, so the time can be offset by performing correction in advance with the modulating means 103.

Figure 12:
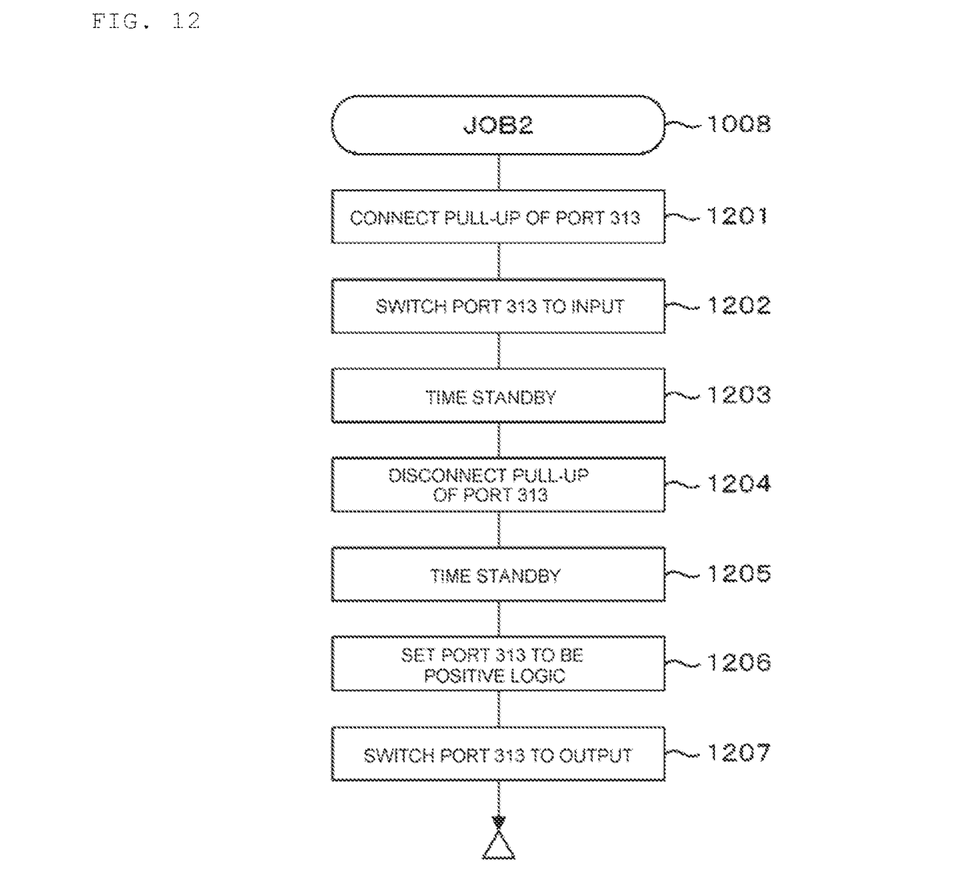
FIG. 12 is a flow chart illustrating the operation of the modulating circuit according to the embodiment of the invention.

FIG. 12 illustrates a flow chart when the operation is performed by the calculation circuit. JOB 2 is timer interruption at the time of pulse trailing edge, and only a part of the flow chart which relates to the operation of the pulse signal 210 in the process performed by the JOB2 (1008) is extracted. If the JOB2 interruption is generated, the pull-up of the terminal 313 is first connected in process 1201. Thereafter, the terminal 313 becomes the input terminal so that the transistor 203 is operated in the active region. In order to maintain this state for a certain period of time, a time standby process is performed in process 1203. Thereafter, the pull-up of the terminal 313 is disconnected and the transistor 203 is disconnected to perform a time standby process again in process 1205. Next, the output of the terminal 313 is set to be positive logic in process 1206 and then the terminal 313 is changed to the output terminal in process 1207. Though FIG. 12 illustrates the embodiment of the invention in which the calculation circuit is used, the same advantage can be obtained by performing the invention with a logic circuit such as a gate array.

Further, if the processes are performed in the leading edge operation of the pulse signal in reverse order, the leading edge waveform can be smoothed. Therefore, the same advantage as described above can be obtained.

As described above, according to the present embodiment, even in a case where a signal output circuit may not be changed easily, such as an output of a general-purpose microcomputer, through rate control can be performed so that radiated noises of an output pulse signal can be reduced. Further, since the through rate control can be performed without an external component and the degree can be adjusted easily, pulse signal output means can be configured at a low price.

Embodiment 2

Subsequently, a second embodiment of the invention is described with reference to FIGS. 13 and 14.

According to the present embodiment, connection and disconnection of the pull-up FET 311 is performed twice during a period in which the terminal 313 is set to be the input terminal so that the waveform operation of the pulse signal 210 is performed more freely.

Figure 13:
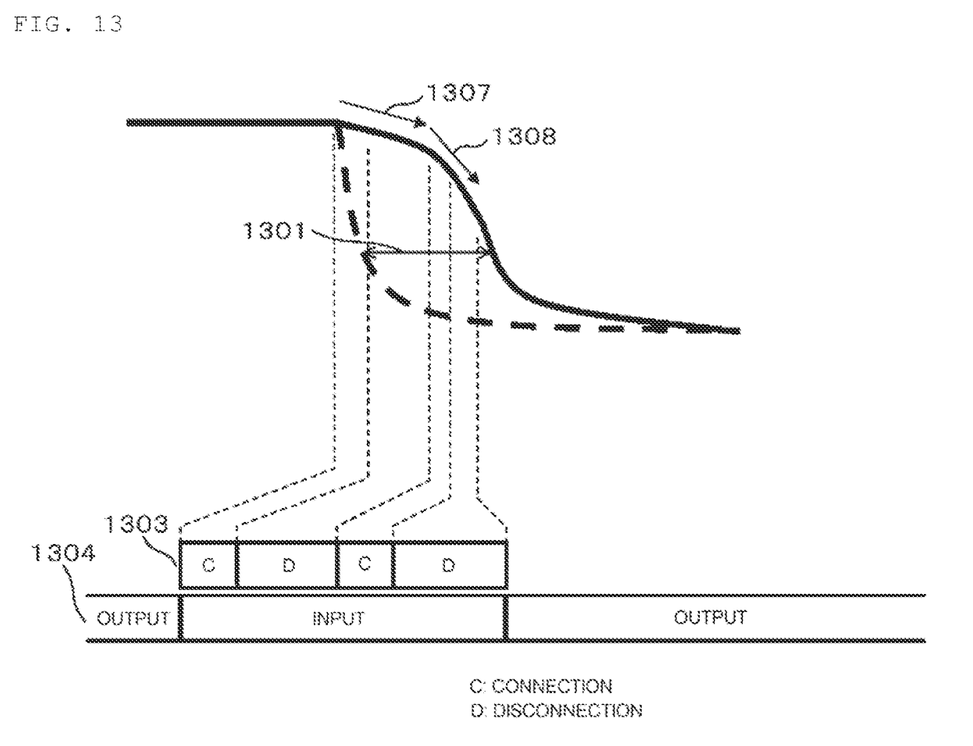
FIG. 13 is a diagram illustrating an operation of a modulating circuit according to another embodiment of the invention.

In FIG. 13, reference number 1307 indicates a first operation region of the transistor 203, and reference number 1308 indicates a second operation region in which the waveform is smoothed in two stages by performing the connection and disconnection twice. According to this, since an electric current flowing through the capacitor 204 or a steep electric current flowing through the wire harness is spread. Therefore, the radiated noises can be decreased more.

Figure 14:
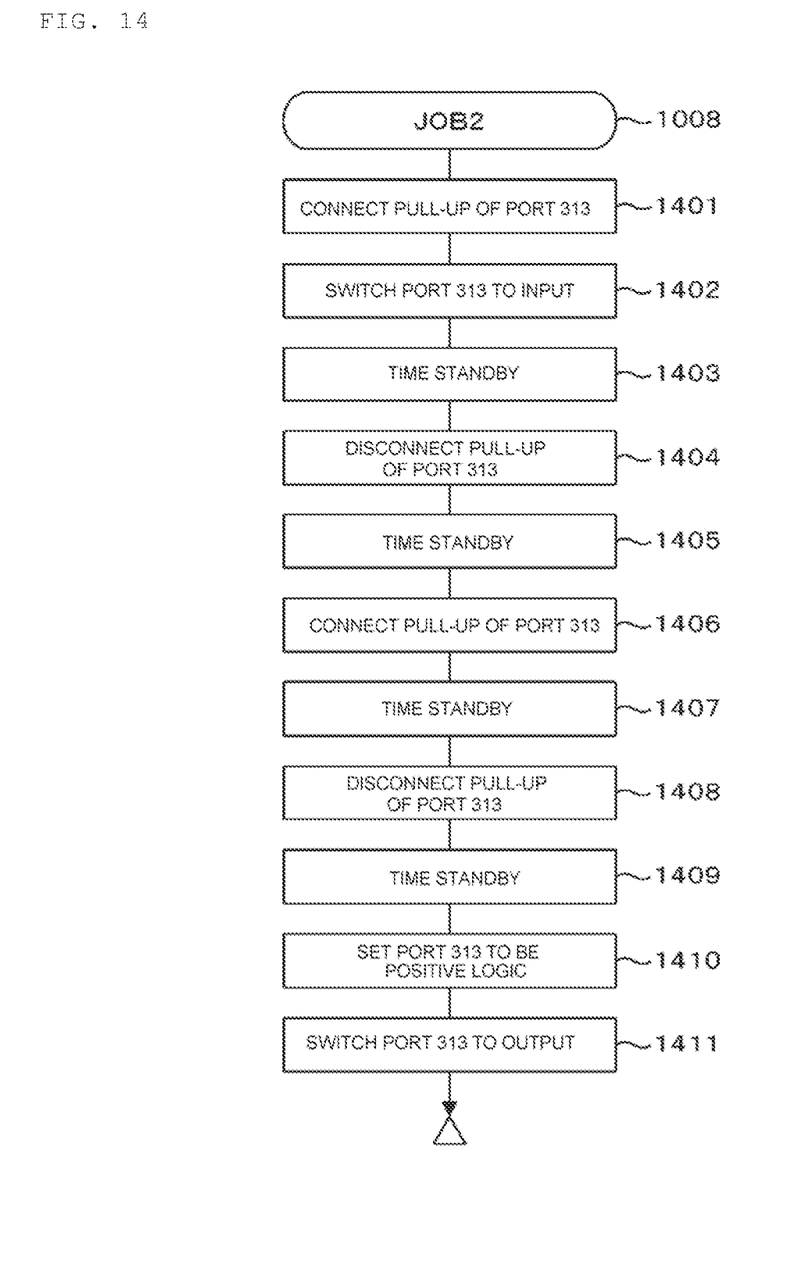
FIG. 14 is a flow chart illustrating the operation of the modulating circuit according to another embodiment of the invention.

A description is made with reference to a specific flow chart illustrated in FIG. 14. Processes 1401 to 1405 are the same portion in the flow chart according to the first embodiment illustrated in FIG. 12. According to the present embodiment, the number of times of waveform operations is increased by adding one set of the connection and disconnection of the pull-up FET 311 in the processes 1406 to 1409. For example, though the operation is performed twice, the same advantage can be obtained by performing the connection and disconnection three times or more, changing the number of times of the operations depending on situations, and changing or switching a pull-up period, a standby time, and the like, respectively.

REFERENCE SIGNS LIST 101 sensor
102 physical amount detecting means
103 modulating means
105 electronic control device
203 transistor
204 capacitor
210 pulse signal
311 pull-up FET
1001 reference clock signal
1003 timer
1007 interruption process (JOB1) at the time of leading edge
1008 interruption process (JOB2) at the time of trailing edge

The invention claimed is:

1. A pulse signal outputting apparatus which includes physical amount detecting means for detecting a physical amount, and modulating means for performing pulse modulation on output information obtained from the physical amount detecting means, and which outputs a pulse signal generated by the modulating means,
    wherein the modulating means includes:
        a calculation circuit that has a pull-up resistor which is connected to a power supply;
        a general-purpose input/output terminal that is connected to the calculation circuit;
        input/output selecting means for selecting whether the general-purpose input/output terminal is used as an input terminal or an output terminal;
        pull-up resistor connecting means for connecting or disconnecting the pull-up resistor and the general-purpose input/output terminal; and
        a pull-up resistor connection control circuit that performs control so that the pull-up resistor connecting means is operated when the general-purpose input/output terminal is selected as the input terminal,
    wherein the general-purpose input/output terminal is selected as the input terminal by the input/output selecting means when a transition of an output signal level of the pulse signal starts,
    wherein the pull-up resistor and the general-purpose input/output terminal are connected by the pull-up resistor connecting means when the general-purpose input/output terminal is selected as the input terminal, and
    wherein the general-purpose input/output terminal is switched to the output terminal by the input/output selecting means after a certain period of time is passed.

2. The pulse signal outputting apparatus according to claim 1, comprising:
    a transistor connected to the modulating means,
    wherein the transistor is driven in an active region when the pull-up resistor is connected to the general-purpose input/output terminal.

3. The pulse signal outputting apparatus according to claim 1, comprising:
    a transistor connected to the modulating means,
    wherein a potential at a base or a gate of the transistor is not continuous and is controlled to be two or more values of constant voltage widths.

4. The pulse signal outputting apparatus according to claim 1, wherein connection or disconnection of the pull-up resistor is performed a plurality of times.

5. The pulse signal outputting apparatus according to claim 1, wherein the pull-up resistor uses a resistance component of a semiconductor junction.

6. The pulse signal outputting apparatus according to claim 1, wherein a receiving side of the pulse signal output by the pulse signal outputting apparatus uses a duty ratio, a leading edge, or a trailing edge of the pulse signal.

7. The pulse signal outputting apparatus according to claim 1, wherein at least one of existence/non-existence, the number of times, and an operation period of time of a connection and disconnection operation, and the pull-up resistance value of the pull-up resistor is variable after an electric current is applied to the pulse signal outputting apparatus.

8. The pulse signal outputting apparatus according to claim 1, wherein connection and disconnection of the pull-up resistor and an operation of selecting the general-purpose input/output terminal are performed even at a leading edge of the pulse signal.

* * * * *